United States Patent [19]

Tada et al.

[11] Patent Number: 5,077,752
[45] Date of Patent: Dec. 31, 1991

[54] SEMICONDUCTOR LASER

[75] Inventors: Kunio Tada, Urawa; Yoshiaki Nakano, Tokyo; Yi Luo; Takeshi Inoue, both of Musashino; Haruo Hosomatsu, Tokyo; Hideto Iwaoka, Hachioji, all of Japan

[73] Assignee: Optical Measurement Technology Development Co., Ltd., Tokyo, Japan

[21] Appl. No.: 546,320

[22] Filed: Jul. 2, 1990

[30] Foreign Application Priority Data

Jun. 30, 1989 [JP] Japan ............................. 1-168729
Jul. 18, 1989 [JP] Japan ............................. 1-185001
Jul. 18, 1989 [JP] Japan ............................. 1-185002
Jul. 18, 1989 [JP] Japan ............................. 1-185003

[51] Int. Cl.$^5$ ............................................. H01S 3/08
[52] U.S. Cl. .................................. 372/96; 372/45; 372/102
[58] Field of Search ................... 372/96, 45, 43, 102

[56] References Cited

U.S. PATENT DOCUMENTS 4,803,691  2/1989  Scifres et al. .................. 372/45
4,980,895  12/1990  Nishimura ...................... 372/96

FOREIGN PATENT DOCUMENTS 0064887  5/1977  Japan ............................. 372/96

OTHER PUBLICATIONS

Nakamura et al., "GaAs-Ga$_{1-x}$Al$_x$ As Double-Heterostructure Distributed Feedback Diode Laser", Appl. Phys. Lett., vol. 25, No. 9, Nov. 1974, pp. 487–488.

Primary Examiner—Georgia Epps
Attorney, Agent, or Firm—Cushman, Darby & Cushman

[57] ABSTRACT

A distributed feedback semiconductor laser having a diffractive grating on an active layer in order to generate stimulated emission by recombing electrons with positive holes thereon by the light distributed feedback. This laser can achieve precisely single wavelength longitudinal mode lasing as a thin buffer layer is grown on the surface of the semiconductor layer which has been etched with irregular pattern corresponding to the diffractive grating while the corrugated pattern is being maintained intact and an active layer is grown on the surface thereof in a manner to fill in the valleys of the corrugated pattern as much as possible so that a diffractive grating is formed on the active layer and light distributed feedback is caused mainly by the periodic perturbation of gain coefficients stimulated by the diffractive grating.

6 Claims, 12 Drawing Sheets

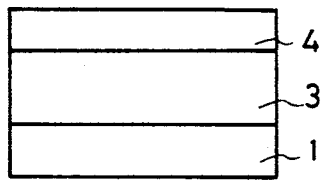
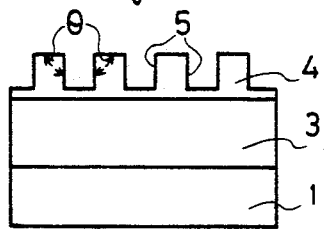
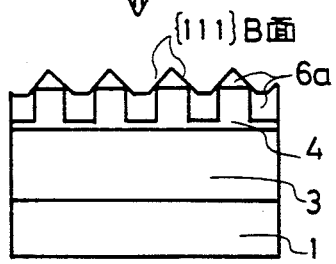
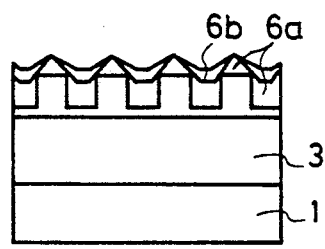
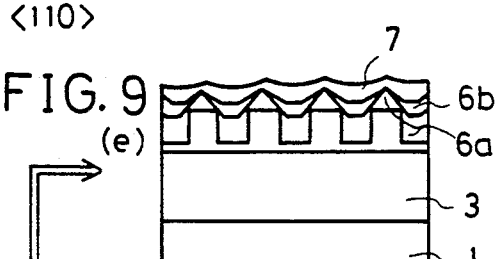
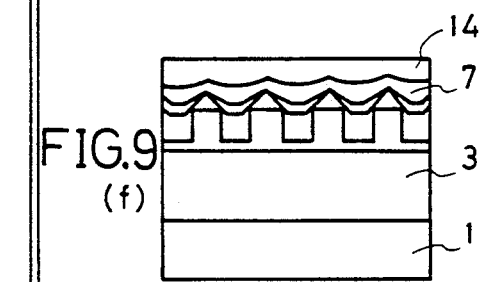
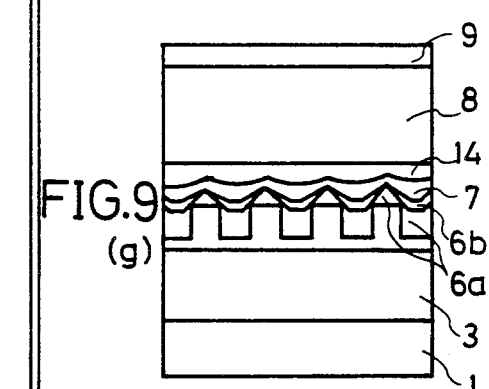

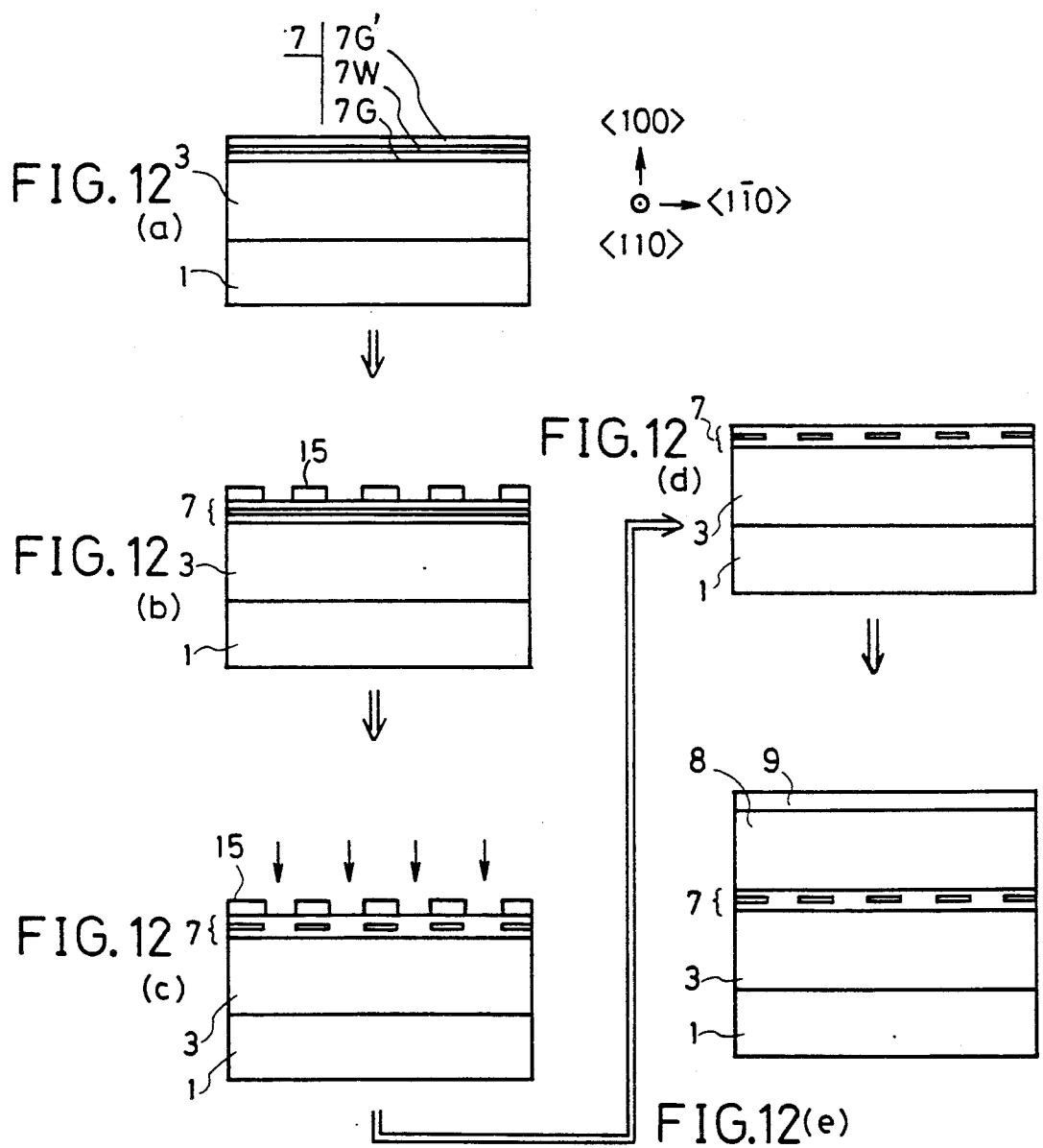

SEMICONDUCTOR LASER

This invention relates to a semiconductor laser which is used as an electro-optic convertor and the manufacturing method therefor.

This invention is suitable for use as a light source for optical communication systems, optical information processing systems, optical memory systems, optical measuring instruments and other opto-electronic devices.

BACKGROUND

There is widely known a distributed feedback semiconductor laser which causes its active layer to generate stimulated emissions by light distribution feedback with a diffraction grating formed close to the active layer. Since the distributed feedback semiconductor laser relatively easily provides stimulated emission with excellent lasing spectral characteristics, and the lasing wavelength can be controlled by the pitch of the diffraction grating, its use is promising as the light source of long-distance and large-capacity optical communication systems and other opto-electronic devices which either utilize single mode optical fibers or wavelength division multiplexing.

Light distributed feedback in the conventional lasers is given by forming a transparent light guiding layer proximal to an active layer, forming corrugated shapes having a cross section substantially similar to triangular waves on the surface thereof other than the side near the active layer, and changing the apparent refractive index of the guiding layer periodically. The structure is popularly known and is described, for instance, in Denshi-Joho-Tsushin Handbook, pp. 984-985, a general handbook published by Ohm Sha, Japan 1988. The semiconductor laser of this structure, however, cannot conduct adequate feedback in optical phase with respect to light of Bragg wavelength generated corresponding to the period of changes in layer thickness in the light guiding layer to thereby cause stop bands in the zone of Bragg wavelength. FIG. 1 shows this phenomenon.

More specifically, FIG. 1 is a graph which plots lasing wavelength in normalized value on the horizontal axis and spectral intensity in relative value on the vertical axis. The graph shows that there is a phenomenon which causes two isolated longitudinal mode lasings at two wavelengths substantially symmetrical on both sides of the Bragg wavelength. There has been empirically, known from various tests that it is difficult to design and manufacture practical semiconductor lasers in a manner to cause either one of the two longitudinal mode lasings or to preset either one of them. Production yield cannot be increased due to the above reason.

In order to solve the problem, there has been proposed a structure which shifts the diffraction grating in phase by one quarter of a wavelength at about the center thereof. This increases the difference in gain between two longitudinal modes at two wavelengths to thereby enable setting the lasing mode at one. But the structure requires a special manufacturing process because of the complicated form of diffraction grating. The structure is further detrimental as it needs anti-reflection coating on the facet of a laser diode to thereby increase the number of manufacturing steps and also the production cost. The semiconductor laser of this structure is also described in the above mentioned handbook.

"Coupled-Wave Theory of Distributed Feedback Lasers" by Kogelnik et al., Journal of Applied Physics, 1972, vol. 43, pp. 2327-2335 presents the following basic theory: although a stop band is created in the Bragg wavelength zone when light distributed feedback is given by index coupling as above, if the light distributed feedback is conducted by gain coupling based on periodic perturbation of gain coefficient longitudinal mode, then lasing of completely single wavelength should be obtained without generating any stop band. The paper is a theoretical one and gives no description on the structure of semiconductor lasers nor the manufacturing method to embody such gain coupling.

Some of the present inventors filed in Japan on July 30, 1988, a patent application (Sho 63-189593) for a novel semiconductor laser, which applies that basic theory of Kogelnik et al. (referred to hereinafter as a "prior application").

The technology of the prior application teaches the provision of a non-transparent semiconductor layer near an active layer, of diffraction grating on the non-transparent layer and distributed feedback based on periodic perturbation of loss coefficient of the non-transparent layer.

The above structure embodies the device which satisfies the theory of Kogelnik et al., but as this method forms an non-transparent layer near the active layer for feedback, and as the non-transparent layer has absorption loss of energy, the energy required for generation of stimulated emission become inconveniently large.

It would be optimal to form a diffraction grating on one of the surfaces of the active layer and to change the thickness of the layer in accordance with the corrugation of the diffraction grating in the direction of the light waves in order to give distributed feedback in a manner to cause periodic perturbation of gain coefficients based on the above theory. A paper by Nakamura et al. entitled "GaAs-GaAlAs Doublehetero Structure Distributed Feedback Diode Lasers", Applied Physics Letters, 1974, vol. 25, pp. 487-488, reports on the result of experiment to etch diffraction grating directly on the active layer of a semiconductor laser, although it was not for the purpose of realizing gain coupling. However, when the active layer is etched to have a corrugation as diffraction grating, a series of processes for forming the corrugation, i.e., suspending the growth, etching the layer, and resuming the growth, will cause defects in the semiconductor crystal in the layer. The defect in the semiconductor crystal increases non-light-emitting recombination to reduce the stimulating emission remarkably, thus producing semiconductor laser of inferior efficiency which is not practically usable.

This invention eliminates such defects encountered in the prior art, and realizes a semiconductor laser which can give light distributed feedback by gain coupling mainly based on the periodic perturbation of gain coefficients in accordance with the theory by Kogelnik et. al. instead of index coupling which tends to entail formation of stop bands. This invention also embodies a semiconductor laser without loss in energy absorption as is caused in the non-transparent layer in the prior application, and further, without defects in the semiconductor crystal structure even if the active layer is directly formed with diffraction grating.

More particularly, this invention provides a semiconductor laser which has a stable and single lasing mode instead of two lasing modes and which is capable of setting the single lasing mode in advance. The inventive laser is simple in structure as is its manufacturing process, has an excellent production yield, is low in cost, has no loss in energy absorption unlike the prior application laser, is free of defects in semiconductor crystal structure which is to become an active layer even if diffraction grating is formed thereon, and can efficiently produce stimulated emission. Its manufacturing method is also efficient.

SUMMARY OF THE INVENTION

This invention is characterized by the steps of etching a corrugation corresponding to a diffraction grating on the surface of a semiconductor layer which will become a substrate for growing an active layer, growing first a thin semiconductor buffer layer on the surface of said semiconductor layer maintaining the corrugation intact, and growing an active layer on the surface thereof in a manner to fill the corrugation valleys thereon as much as possible.

More particularly, the first aspect of this invention relates to the structure of a semiconductor laser wherein one surface of an active layer is formed with a corrugation as diffraction grating, a thin semiconductor buffer layer is formed in contact with the one surface of the active layer, and the shape of the buffer layer is substantially congruent with the corrugated forms of both of its sides.

The manufacturing process is simpler if the thickness of the buffer layer is made uniform so that the corrugated form on both surfaces thereof are parallel to each other, but they do not have to be necessarily precisely parallel to each other.

The active layer is grown upon the corrugation on the buffer layer in a manner to fill in the dents, and as a result, the other surface of the active layer is formed flat. However, the other surface of the active layer does not have to be necessarily precisely flat but may be left with slight corrugation from the buffer layer.

The active layer may be a single quantum well layer or a multi quantum well layer. In such a case, the active layer has a structure formed with a quantum well layer sandwiched with graded index layers (GRIN-layer or GI-layer) from both sides, for instance. As epitaxial growth rate is larger in valleys than in projections, the width of a quantum well on the valleys becomes relatively larger than that on projections consequently.

The second aspect of this invention lies in the manufacturing method of a semiconductor laser which is characterized by the production steps of etching a corrugation with valleys and hills corresponding to a diffraction grating on a surface of a semiconductor layer, growing a thin buffer layer on the surface of the semiconductor layer while preserving the corrugated form thereof, and growing an active layer upon the corrugation in a manner to fill in the valleys for emission of stimulated light.

More particularly, according to this invention, diffraction grating is formed on the active layer itself via a buffer layer so as to form the active layer with distribution of the thickness in accordance with the corrugated form thereof. Moreover, as the active layer is not directly etched to form the corrugated pattern, the active layer is free of defects latent to the semiconductor crystal structure. Therefore, the thickness of the buffer layer may be determined to be sufficiently thin so that the corrugation on the surface which contacts with the active layer may serve as a diffraction grating but thick enough to cover the defects of the crystal structure on the semiconductor surface. The thickness thereof may be 0.01–1 $\mu$m.

The method to control the growth rate may be one of the methods suitable to grow a buffer layer with the corrugated pattern thereof maintained and to grow an active layer in a manner to fill in the valleys of the buffer layer.

The process to grow a buffer layer is preferably the metal organic vapor phase epitaxy method (MOVPE) but is not limited to it. The present inventors have also noted the efficacy of the molecular beam epitaxy method (MBE). Various other methods to grow a layer with its corrugation preserved may be used to realize this invention.

The corrugated pattern corresponding to the diffraction grating may be directly etched on a cladding layer which is provided to enclose light or etched on another semiconductor layer provided on a surface of the cladding layer.

The method to etch the corrugated pattern on said semiconductor layer may preferably be the interference exposure method of electron beam exposure method and anisotropic etching method.

It is preferable to emphasize the valleys and the hills of the corrugation in growing the buffer layer by setting a condition under which there is no growth or less growth on, for instance, {111} B face.

The third aspect of this invention relates to the structure of the semiconductor laser wherein one surface of an active layer is formed with a corrugated pattern as diffraction grating, a thin semiconductor buffer layer is formed contacting with the corrugation formed on the one surface of the active layer, and the buffer layer has a structure epitaxially grown to transfer the corrugated pattern formed by etching on the semiconductor layer with which the other surface of the buffer layer contacts to the corrugated pattern formed on said active layer.

The fourth aspect of this invention relates to a method for manufacturing a semiconductor laser which includes etching a corrugated pattern corresponding to a diffraction grating on a surface of a semiconductor layer, growing a thin buffer layer on the surface of the semiconductor layer with the corrugated pattern maintained, growing an active layer for stimulated emission upon the corrugated pattern appearing on the buffer layer using the pattern as a diffraction grating in a manner to fill in the valleys of the pattern, and which is characterized in that the step of growing the buffer layer using the patterns as a diffraction grating in a manner to fill in the valleys of the patterns, and which is characterized in that the step of growing the buffer layer includes a step of growing a first buffer layer in a manner to reshape the patterns etched on the semiconductor surface so as to emphasize the dent/projection patterns and a step of growing a second buffer layer upon the first buffer layer in the form suitable for a diffraction grating formed on a surface of the active layer.

The active layer itself may be formed with diffractive grating by forming the active layer with a quantum well layer sandwiched therein and disordering the quantum well layer in a period corresponding to the diffractive grating.

The fifth aspect of this invention relates to a semiconductor laser having the structure comprising an active layer for stimulated emission and a diffraction grating provided on the active layer for light distributed feedback, which is characterized in that the active layer includes a quantum well layer, and the diffraction grating is produced as the result of disordering of the quantum well layer in accordance with the period of the diffraction grating to eliminate the same.

The term disordering herein means homogenization of a locally non-uniform composition in a substance by mutual diffusion, and the process may remarkably be accelerated by ion implantation or other methods.

The sixth aspect of this invention relates to a method for manufacturing a semiconductor laser comprising a first step for growing a first cladding layer, a second step for growing an active layer on the first cladding layer, and a third step for growing a second cladding layer upon the active layer, the second step including the step of forming an active layer having a quantum well layer, which is characterized in that between said second and third steps there is provided a step of disordering said quantum well layer in accordance with the period of diffraction grating.

The disordering step comprises a step of forming masks over the locations on the active layer formed by the second step in accordance with the period and a step of ion implantation from above the active layer which is partly covered with the masks.

The disordering step may be effected by emitting focused ion beams (FIB) intermittently in accordance with the period of the diffraction grating from above the active layer formed by the second step.

The semiconductor laser according to any one of the first to fourth aspects mentioned above periodically changes the thickness of the active layer in the direction of advancing light waves in the corrugated pattern with valleys and hills of the diffraction grating. The semiconductor laser according to the fifth and sixth aspects has a quantum well layer of the active layer which is disordered in accordance with the period of the diffraction grating in the direction of advancing light waves. Light distributed feedback is conducted by gain coupling based on the periodic perturbation of gain factors in the theory of Kogelnik et al. Therefore, the device can conduct a stable single mode lasing which is simply determinable with the period of diffraction grating without generating stop bands in specific wavelength zone nor producing longitudinal mode lasings at two wavelengths above and below the wavelength zone. The stable and singular mode lasing wavelength may be set in advance as it corresponds to the Bragg wavelength, and the laser may be designed and manufactured accordingly.

The semiconductor laser according to this invention forms a diffraction grating substantially on the active layer per se. The technology disclosed in the prior application mentioned above is essentially different from this invention as the prior application technology provides a non-transparent semiconductor layer proximally to an active layer and conducts light distributed feedback with the diffraction grating thereon although both technologies conduct light distributed feedback by gain coupling based on the periodic perturbation of gain factors taught by the theory of Kogelnik et al. While the prior application technology is defective because of light energy absorption into the non-transparent semiconductor layer, the semi-conductor laser according to the present invention does not have anything equivalent to the non-transparent layer and is free of such defects as optical energy absorption, and therefore has a higher efficiency in excitation energy.

This invention can achieve a remarkable improvement compared with the conventional structure which has diffraction grating etched directly on the active layer. More particularly, according to the conventional technology, after growing an active layer, the growth is suspended temporarily to allow a diffraction grating to be etched thereon, and then a semiconductor layer as a cladding layer is grown again thereon to produce defects in the semiconductor crystal structure of the active layer. Conversely, in the present invention, either one of the following processes is employed: (1) A semiconductor which will be the substrate for growing an active layer is etched with a corrugated pattern corresponding to a diffraction grating, a thin buffer layer is grown upon the corrugated pattern maintaining the corrugated pattern, and an active layer is formed upon the corrugated pattern of the buffer layer, and (2) a quantum well layer on the active layer is disordered to form a diffraction grating. In the former case, the defects in the semiconductor crystal structure caused by a series of operations before and after etching will gradually be covered with the buffer layer which is grown thereupon to form a diffraction grating with the corrugated pattern free of defects on a surface of the active layer. In the latter case, the active layer is formed with a diffraction grating without defects of semiconductor crystal structure.

In the former case, the growth of the active layer is controlled so as to fill in the valleys of the corrugated pattern. Consequently, the obtained active layer has the thickness distributed according to the corrugated pattern. This causes a desired perturbation in the light confinement factor and carrier density of the active layer in the direction of the laser resonator axis. Ultimately, gain coefficient for the light waves transmitting in the direction of the resonator axis changes in the period which is coincidental to the period of the diffraction grating to realize light distributed feedback by gain coupling. In the latter case, a desired perturbation is caused in the structure and carrier density of the active layer in the direction of laser resonator axis, and ultimately, gain factor for the light waves transmitting in the direction of the resonator axis changes at the period which is coincidental to the period of the diffraction grating to realize distributed feedback by gain coupling.

As the position of standing waves within the resonator is fixed coincidentally to the period of the changes in gain coefficients in this invention structure, it becomes less prone to the influence of reflection from the facet of a laser diode, and the device does not necessarily require an anti-reflection coating procedure in order to obtain single longitudinal mode lasing. Compared to the structure which shifts the phase of the diffraction grating by one quarter of the wavelength mentioned above, this invention's laser becomes remarkably simpler in structure, less in the number of manufacturing processes, and higher in production yield.

It is preferable to select a method for growing a thin buffer layer with a corrugated pattern preserved as it is in a manner to minimize filling of the valleys by the growth. As a practical method, above mentioned metal organic vapor phase epitaxy method is highly preferable. This invention can be realized even if the corrugated pattern formed on one surface of the active layer is not completely congruent with the corrugated pattern formed before the growth of the buffer layer so long as the corrugated pattern on the active layer substantially serves as a diffraction grating and defects in the semiconductor crystal structure are limited within the practical scope. So far as the thickness of the buffer layer and the growth rate are suitably selected, various methods other than above mentioned metal organic vapor phase epitaxy method may realize the present invention.

A method to disorder the quantum well layer periodically is preferably the ion implantation method. When masks are arranged on the surface of an active layer in the pattern corresponding to the period of the diffraction grating and ion is implanted uniformly over the surface thereof, the quantum well layer will remain as it is at the portions covered with the masks, but will disappear due to disordering at the portions which are not covered with masks so that an intermittent quantum well layer which is periodically disordered is formed.

Alternatively, such quantum well structure may be periodically disordered by scanning the surface of the active layer with focused ion beams and by intermittently supplying or generating the ion beams coincidentally to the period of the diffraction grating.

BRIEF DESCRIPTION OF DRAWINGS

FIGS. 8(a)-9(g) are sectional views showing the manufacturing procedure of the fourth embodiment of this invention.

FIGS. 12(a)-12(e) are sectional views showing the manufacturing procedure of the seventh embodiment of this invention.

DETAILED DESCRIPTION OF INVENTION

The present invention is now described in more detail referring to preferred embodiments shown in the attached drawings.

Figure 2:
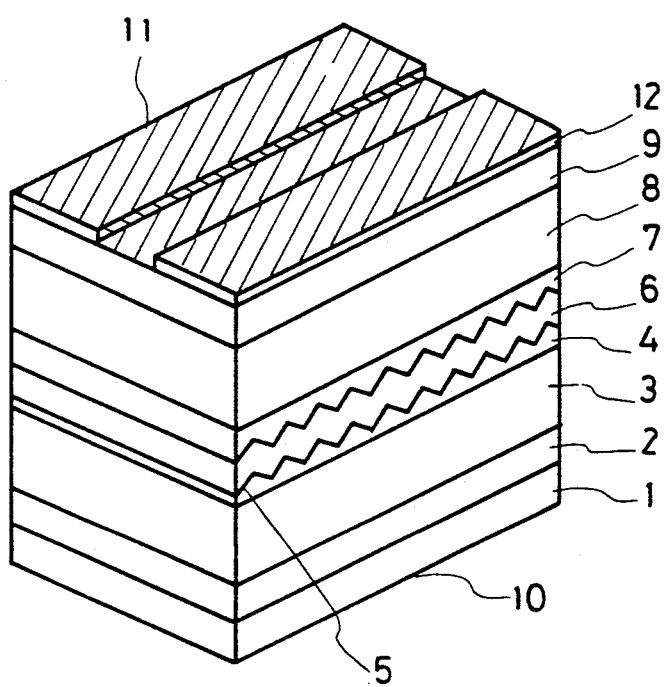
FIG. 2 is a perspective structural view of the first embodiment of the invention.

FIG. 2 is a structural view to show the first embodiment of a semiconductor laser according to this invention. Respective layers of semiconductor laser diodes of double hetero junction structure are continuously grown on an n+-GaAs substrate 1 in two stages by an epitaxial growth device by the metal organic vapor phase epitaxy method.

In the first stage, on the substrate 1 are continuously and successively grown an n+-GaAs layer 2 of 0.5 μm thickness, an n-Al$_{0.45}$Ga$_{0.55}$As cladding layer 3 of 1 μm thickness, and an n-Ga$_{0.94}$Al$_{0.06}$As semiconductor layer 4 (the semiconductor epitaxial layer) of 0.2 μm thickness by the metal organic vapor phase epitaxy method. Then, the semiconductor layer 4 which is the topmost of the first-stage grown layers is etched by an interference exposure method and chemical etching capable of anisotropic etching to expose facets of (111) and (1$\bar{1}$1) in the corrugated pattern 5 corresponding to the diffraction grating of the period of 225 nm.

In the second stage of epitaxial growth, upon the semiconductor layer 4 which has been etched with the diffraction grating 5 is grown an n-Al$_{0.40}$Ga$_{0.60}$As buffer layer 6 of the average thickness of 0.15 μm, upon which a non-doping GaAs active layer 7 of the average thickness of 0.1 μm, a p-Al$_{0.45}$Ga$_{0.55}$As cladding layer 8 of the thickness of 1 μm, and a p+-GaAs contact layer 9 of the thickness of 0.5 μm are successively and continuously grown by metal organic vapor phase epitaxy to complete a double hetero junction structure.

Then, an SiO$_2$, insulation layer 12 is deposited on the upper surface of the p-type contact layer 9 to form windows in stripe in the width of ca. 10 μm, for instance, and an Au-Zn electrode layer 11 of the positive side is vapor-deposited over the whole surface. Au-Ge electrode layer 10 of the negative side is vapor-deposited on the lower surface of the n-type substrate 1. The semiconductor block having the above structure is cleaved to complete semiconductor laser diodes respectively.

In the embodiment shown in FIG. 2, there is provided especially a semiconductor layer 4 upon the cladding layer 3 and a corrugated pattern corresponding to the diffraction grating is etched on the semiconductor layer 4. A buffer layer 6 is grown upon the semiconductor layer 4 above the corrugated pattern by metal organic vapor phase epitaxy with the pattern of the diffraction grating maintained intact. Then an active layer 7 is grown upon the buffer layer 6 in a manner to fill in the valleys of the corrugated pattern. This enables fabrication of the diffraction grating on the underside of the active layer 7. As described above, in growing the buffer layer 6, the valleys of the corrugated pattern are preserved while in the growth of the active layer 7 the valleys are filled. Such growth is achieved by controllably varying the growth rate and/or other factors.

The control of the growth factors is relative, though. It would suffice if only the active layer 7 is formed on a surface thereof with a corrugated pattern which can substantially act as diffraction grating, the other surface of which is formed substantially flat, and a buffer layer 6 is grown on the corrugated pattern in a manner to protect the corrugated pattern of the active layer 7 which acts as the diffraction grating from the effect of the defects in the semiconductor crystal structure caused by etching.

Figure 3:
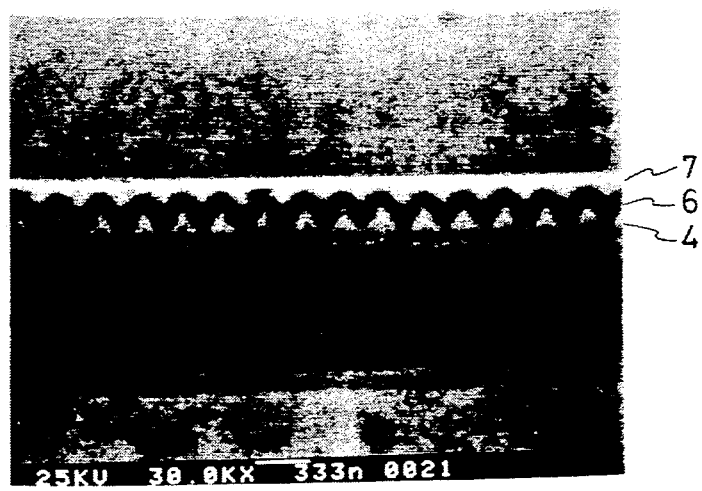
FIG. 3 shows the result of observation of the section of the first embodiment of this invention by a scanning electron microscope (SEM).

FIG. 3 shows the result of observation by a scanning electron microscope of the section of a diode fabricated as above. The presence of the semiconductor layer 4, the buffer layer 6 and the active layer 7 is observed in the SEM pattern. It is obvious from FIG. 3 that a diffraction grating is formed on the lower surface of the active layer 7. The diffraction grating thus formed on the active layer 7 causes periodic changes in gain coefficient and enables fabrication of a semiconductor laser which can produce single mode lasing at Bragg wavelength corresponding to the period of the changes in gain coefficient due to light distributed feedback based on the perturbation of gain coefficients.

In the above embodiment, the semiconductor layer 4 is formed upon the cladding layer 3 and layer 4 is etched in a corrugated pattern. This is because if the cladding layer 3 is directly etched to form the corrugated pattern, aluminum in the layer 3 might be oxidized to impair re-growing as the cladding layer 3 has a high aluminum compositional ratio. Therefore, a semiconductor layer 4 having a smaller compositional ratio of aluminum is provided thinly upon the cladding layer 3 and the corrugated pattern is etched thereon. When InP is used as the material for the cladding layer 3, the layer 3 may directly be etched, which case will be described in more detail later.

Figure 4:
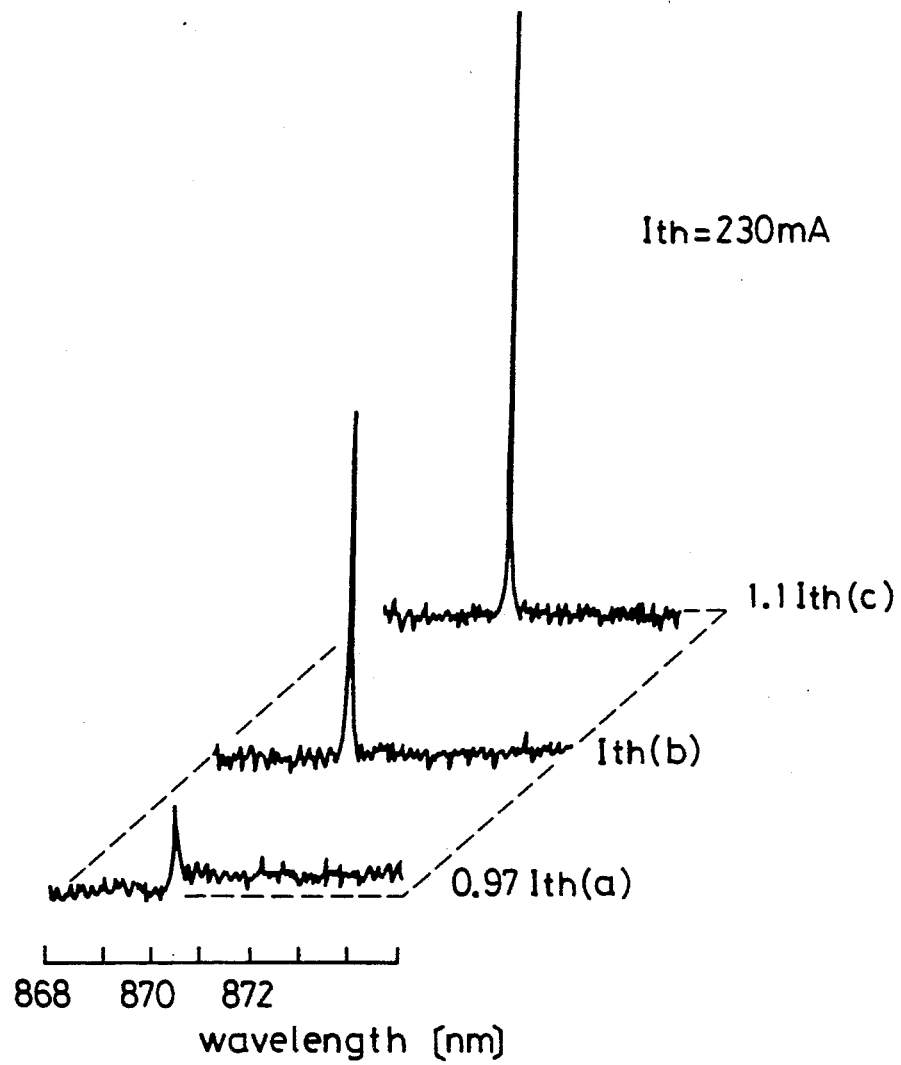
FIG. 4 is a graph showing the emission spectrum characteristics of the first embodiment of this invention.

FIG. 4 shows the result of measurement of emission spectrum characteristics of the first embodiment of the distributed feedback semiconductor laser according to this invention.

FIG. 4 shows schematically the wavelength distribution characteristics (a), (b) and (c) of the spectrum obtained when lasing current is increased stepwise from 0.97 $I^{th}$ to $I^{th}$ and 1.1 $I^{th}$ on a trial laser having the structure shown in FIG. 2 which has a threshold current $I^{th}$=230 mA at a temperature of 10° C.

Figure 1:
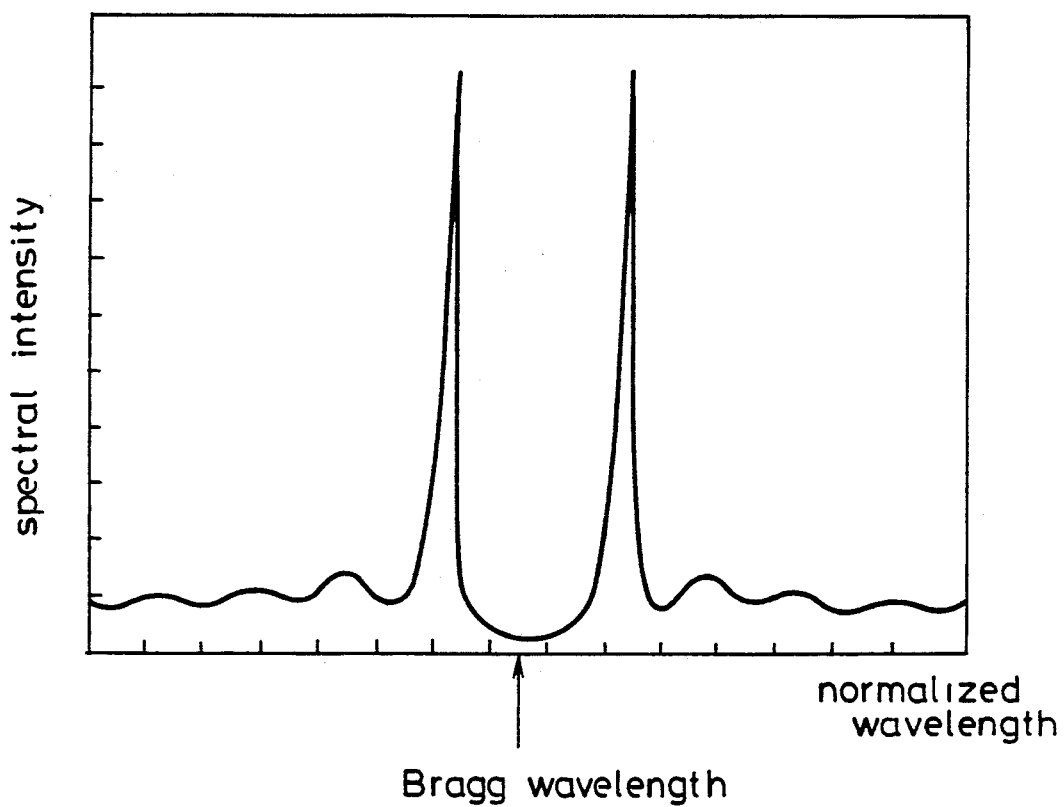
FIG. 1 is a graph showing the emission spectrum characteristics of a conventional laser device.

Upon noting the spectrum characteristics (a) of the present invention laser at the lasing current of 0.97 $I^{th}$ near the threshold in FIG. 4, it is obvious that stop bands centering around the Bragg wavelength shown in FIG. 1 do not appear and the spectrum characteristics show substantially symmetrical patterns vertically in respect of the main mode lasing wavelength of 871 nm. Such spectrum characteristics indicate that the first embodiment of this invention distributed feedback semiconductor laser shown in FIG. 2 performs light distributed feedback in which gain coupling is more dominant than index coupling in accordance with the wave coupling theory of Kogelnik et al. due to the periodic perturbation of gains generated by forming the diffraction grating on the active layer. In this invention distributed feedback semiconductor laser, there is only one main mode existing at the center of the spectrum characteristics shown in FIG. 4 as a longitudinal mode which would be brought to lasing by injected current close to threshold. This invention laser therefore realized a completely single longitudinal mode lasing true to the coupled wave theory of Kogelnik et al.

Figure 5:
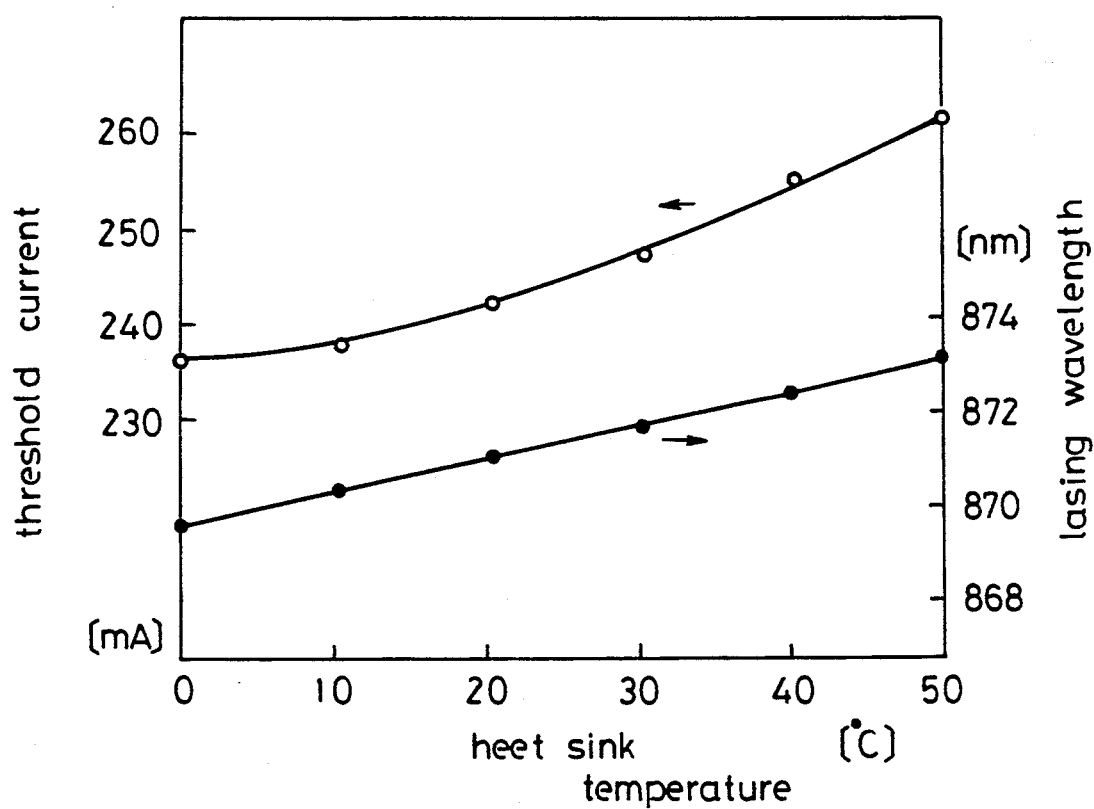
FIG. 5 is a graph showing the temperature characteristics of the first embodiment of this invention.

FIG. 5 shows an example of temperature dependent characteristics of lasing wavelength and threshold current of the first embodiment of this invention distributed feedback semiconductor laser having the above mentioned structure. The temperature dependent characteristics were studied by actually measuring the changes in lasing wavelength and threshold current as against the temperature of a heat sink made of the material having a high thermal conductivity to which the laser is attached in order to prevent a rise in the temperature of the semiconductor laser. It is obvious from the temperature dependent characteristics shown in FIG. 5, this laser does not cause mode hopping even with changes of temperature of 50° C. but operates at a single longitudinal mode with lasing wavelength and threshold changing smoothly and continuously.

The temperature dependent characteristics are comparable to the conventional distributed feedback semiconductor laser of this type, and therefore, it is obvious that due to the gain coupling by diffraction grating provided on the active layer of the semiconductor laser a sufficient distributed feedback which is different from that obtained by the conventional index coupling is effected.

An example of the metal organic vapor phase epitaxy which is directly relevant to this invention among the manufacturing methods applicable to above embodiment is now described in more detail. The example simply illustrates a case which achieved the optimal result and does not limit the scope of this invention. Conditions disclosed herein may be suitably changed to realize the invention according to the know-how possessed by the experts of this field about the manufacturing systems, usable materials and semiconductor production.

TABLE 1

Conditions of Manufacture Process

| | | substrate temperature (°C.) | growth rate (μm/min) | V/III ratio |
|---|---|---|---|---|
| first growth | buffer layer 2 | 780 | 0.09 | 40 |
| | cladding layer 3 | 780 | 0.15 | 30 |
| | semiconductor layer 4 | 780 | 0.10 | 40 |
| second growth | buffer layer 6 | 750 | 0.14 | 30 |
| | active layer 7 | 750 | 0.05 | 40 |
| | cladding layer 8 | 750 | 0.15 | 30 |
| | contact layer 9 | 680 | 0.09 | 40 |

| Materials: | arsine | $AsH_3$ |
|---|---|---|
| | trimethylgallium | $(CH_3)_3Ga$ |
| | trimethylaluminum | $(CH_3)_3Al$ |
| | monosilane | $SiH_4$ |
| | diethylzinc | $(C_2H_5)_2Zn$ |
| Conditions: | | |
| | Pressure 100 Torr | |
| | Total flow volume | 10 slm (hydrogen carrier) |

SECOND EMBODIMENT

Figure 6:
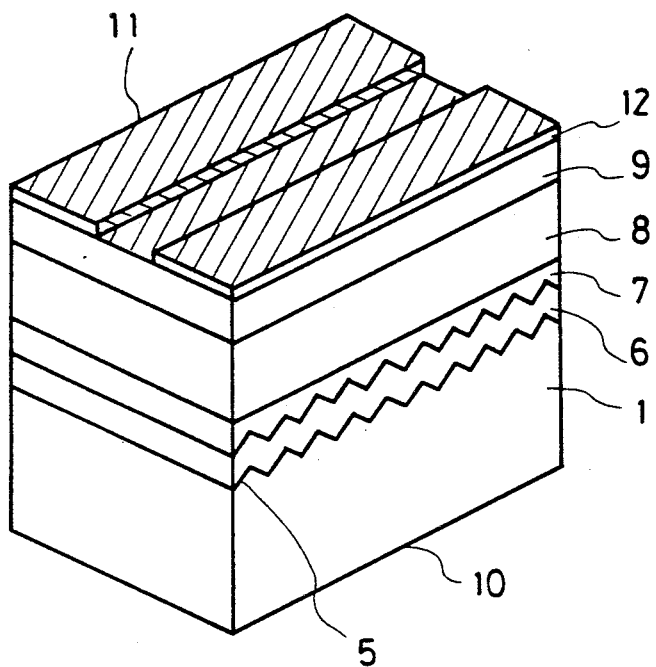
FIG. 6 is a perspective structural view of the second embodiment of this invention.

FIG. 6 shows another structure of the embodiment of this invention wherein no semiconductor layer is provided additionally for etching of the corrugated pattern corresponding to the diffraction grating, but the substrate 1 which acts as a cladding layer is directly etched to grow a buffer layer 6 with the corrugated pattern.

In this structure, InP is used for the substrate 1, InGaP for the buffer layer 6 and InGaAsP for the active layer 7. This structure is suitable for a semiconductor laser which lases either at 1.3 μm or 1.5 μm. This structure is characterized in that only one crystal growing step is required after etching the corrugated pattern on the substrate 1. The buffer layer 6 is preferably formed by metal organic vapor phase epitaxy also in this case.

The above metal organic vapor phase epitaxy method is very promising as a method for forming a buffer layer 6 while maintaining the corrugated pattern as it is.

THIRD EMBODIMENT

Figure 7:
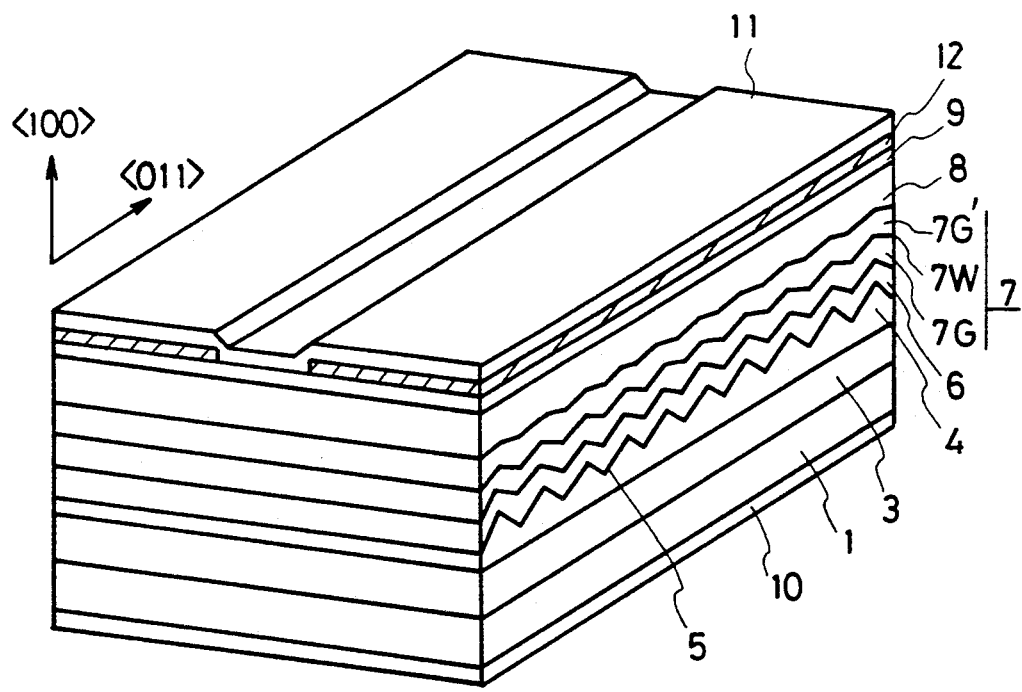
FIG. 7 is a perspective structural view of the third embodiment of this invention.

FIG. 7 is a structural view to show the third embodiment of the semiconductor laser according to this invention. In the figure, respective layers of semiconductor laser diodes of quantum well structure are grown in two stages continuously on an $n^+$-GaAs substrate 1 by metal organic vapor phase epitaxy.

More specifically, in the first stage, an n-type cladding layer 3 is grown on the substrate 1, and an n-

AlGaAs semiconductor layer 4 is grown thereon further by metal organic vapor phase epitaxy. Then, the semiconductor layer 4 or the topmost layer of the grown layers is etched to form a corrugated pattern 5 with exposing the (111) face corresponding to the diffraction grating of 125 nm period by interference exposure method and chemical etching which is capable of anisotropic etching.

In the second stage, an n-AlGaAs buffer layer 6 of the average thickness of 0.1 μm is grown on the semiconductor layer 4 which has been etched with the diffraction grating pattern similarly by metal organic vapor phase epitaxy. It is preferable to use a superlattice of AlGaAs compositional ratio of 0.3 and 0.6 for the buffer layer 6. An n-AlGaAs graded index layer 7G is grown continuously upon the buffer layer 6 in an average thickness of 0.15 nm so as to allow AlAs compositional ratio to change smoothly from 0.6 to 0.3, an extremely thin GaAs quantum well 7W is grown thereupon in an average thickness of 10 nm, and then a p-AlGaAs graded index layer 7G' wherein AlAs compositional ratio smoothly changes from 0.3 to 0.6 is grown thereon in an average thickness of 0.15 μm.

Further, a p-AlGaAs layer is grown thereon as a cladding layer 8 in the thickness of 1.5 μm. A p-GaAs capping layer 9 is grown in the thickness of 0.4 μm. Upon the capping layer 9 are vapor-deposited an insulation layer 12 and an electrode 11.

The structures of respective layers of this embodiment are shown in Table 2.

TABLE 2

| No. | name of layer | aluminum compositional ratio | thickness |
|---|---|---|---|
| 9 | p-capping layer | 0 | 0.4 μm |
| 8 | p-cladding layer | 0.6 | 1.5 μm |
| 7G' | graded index layer (p-type) | 0.6–0.3 | 0.15 μm |
| 7W | quantum well layer | 0 | ca. 10 nm |
| 7G | graded index layer (n-type) | 0.3–0.6 | 0.15 μm |
| 6 | buffer layer | 0.6 (or SL) | 1.5 μm |
| 4 | n-type layer | 0.3 | 0.15 μm |
| 3 | n-cladding layer | 0.6 | 1.5 μm |
| 1 | substrate | 0 | — |

The method for forming the above mentioned active layer 7 including graded index layers and a quantum well is taught by R. Bhat et al. in the paper, "Patterned Quantum Well Heterostructures Grown by OMCVD on Non-planar Substrates: Applications to Extremely Narrow SQW Lasers", Journal of Crystal Growth 93 (1988) pp.850–856, Amsterdam, and those layers may be manufactured by the above description.

The semiconductor laser of quantum well structure is described in the paper by Asada, "Gain Characteristics of Quantum Well Laser and Possibility of Minimizing Threshold by Quantization in High Dimension", Journal of Applied Physics, Vol. 57, No. 5 (1988).

The above mentioned quantum well 7W may be a multiple quantum well (MQW) alternating plural quantum well layers and barriers layers.

FOURTH EMBODIMENT

Figure 8:
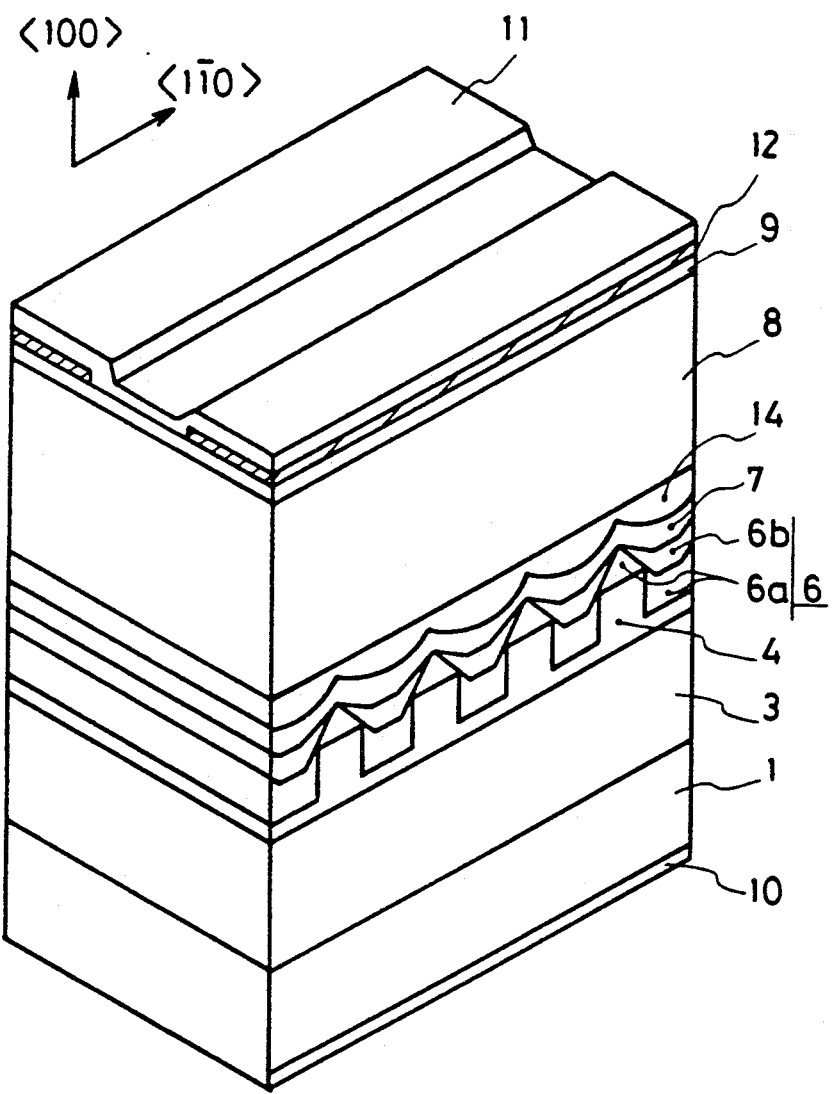
FIG. 8 is a perspective structural view of the fourth embodiment of this invention.

FIG. 8 shows the fourth embodiment of this invention's semiconductor laser in structure wherein various layers of semiconductor laser diodes of double hetero junction structure are grown on an n+-GaAs substrate 1 continuously in two stages by metal organic vapor phase epitaxy.

FIGS. 9(a)–9(g) shows the manufacturing procedure of the fourth embodiment of this invention laser. In the first state, for instance, an n-Al$_{0.45}$Ga$_{0.55}$As cladding layer 3 of the thickness of 1.5 μm and an n-Al$_{0.3}$Ga$_{0.7}$As semiconductor layer 4 of the thickness of 0.2 μm are continuously and successively grown on a substrate 1 ({100}substrate) by metal organic vapor phase epitaxy. The semiconductor layer 4 or the topmost layer is etched by an interference exposure method and chemical etching capable of anisotropic etching to form a corrugated pattern 5 corresponding to the diffraction grating of the period of 255 nm.

Etching is conducted in a manner to form substantially rectangular grooves and the angle Θ shown in FIG. 9(b) is preferably an angle more than 75° and less than 125°. The depth of a groove is ca. 0.15 μm.

In the second stage of the epitaxial growth, a first buffer layer 6a of n-Al$_{0.3}$Ga$_{0.7}$As is grown in the average thickness of 0.1 μm on the semiconductor layer 4 which has been etched with the diffraction grating pattern. The growth is conducted under the conditions which would not grow or have slow growth in {111} B face. As a result, the valleys in the etched diffraction grating in FIG. 9(c) are filled while hills are shaped to be triangular to form the first buffer layer 6a. The conditions to make the growth slow on the {111} B face or to eliminate the growth thereon are described later in detail.

A second buffer layer 6b is grown with n-Al$_{0.3}$Ga$_{0.7}$As of the average thickness of 0.1 μm on the first buffer layer 6a. The second buffer layer 6b is grown under the normal conditions rather than the above mentioned conditions. The cross section of the second buffer layer 6b becomes a form suitable as the diffraction grating and as the plane suitable to grow an active layer thereon as shown in FIG. 9(d). Upon the second buffer layer 6b are grown a GaAs active layer 7 without impurity doping the average thickness of 0.1 μm, a guiding layer 14, a p-Al$_{0.45}$Ga$_{0.55}$As cladding layer 8 in the thickness of 1.5 μm and a p+-GaAs contacting layer 9 in the thickness of 0.5 μm continuously and successively by metal organic vapor phase epitaxy to complete the double hereto junction structure.

An insulation layer 12 with SiO$_2$ is deposited on the upper surface of the p-type contact layer 9 to form windows in stripe of ca. 10 μm width, and Au-Zn electrode layer 11 of the positive side is deposited all over the surface, and Au-Ge electrode layer 10 of the negative side is deposited on the lower surface of the n-type substrate 1. The semiconductor block of the above structure is cleaved to complete individual semiconductor laser diodes.

In the embodiment shown in FIG. 8, an additional semiconductor layer 4 is provided on the cladding layer 3 and the corrugated pattern corresponding to the diffraction grating is etched on the semiconductor layer 4. A buffer layer 6 is grown on the etched semiconductor layer 4 by the metal organic vapor phase epitaxy method so as to exaggerate the form of the diffraction grating. Then, an active layer 7 is grown upon the buffer layer 6 in a manner to fill the valleys in the pattern. This enables formation of the diffraction grating on the lower surface of the layer 7. In the growth of the buffer layer 6 the triangular shapes of the projection are exaggerated while in the growth of the active layer; the valleys are filled. Such growth is performed by changing growth rate and other factors to properly shape the pattern.

The control over the growth conditions is relative, however. It would suffice only if the corrugated pattern is formed on one surface of the active layer 7 to act substantially as the diffraction grating, the other surface thereof is made substantially flat, and a buffer layer 6 is grown in a manner to protect the corrugated pattern on the layer 7 from the effect of defects in the semiconductor crystal structure caused by etching.

In this embodiment, the following conditions were experimentally confirmed to be those which make selective growth without causing the growth on the aforementioned {111} B face. More specifically, by the MOCVD method, growth is conducted under the following conditions:

TMG, TMA, AsH$_3$ group
Pressure 100 Torr, Total flow volume 10 slm
Temperature of substrate 650–750° C.
Growth rate 0.005–0.15 μm/min
V/III ratio 20–45

Another experiment confirmed that when the substrate temperature was increased to 750° C. or more, the growth on {111} B face was slowed.

The conditions which are suitable to selectively cause semiconductor growth to emphasize the corrugated pattern are described by some examples in the Yoshikawa et al. article "A Self Aligned Ridge Substrate Laser Fabricated by Single-Step MOVPE", Journal of Crystal Growth 93 (1988) pp. 834–849. This invention will be effectively realized by setting such conditions as described in the examples.

The aforementioned examples of the conditions, composition and thickness of respective layers of the above mentioned embodiment structures are illustrative of the invention and may be modified by an expert in this field having knowledge and experience thereof.

FIFTH EMBODIMENT

Figure 10:
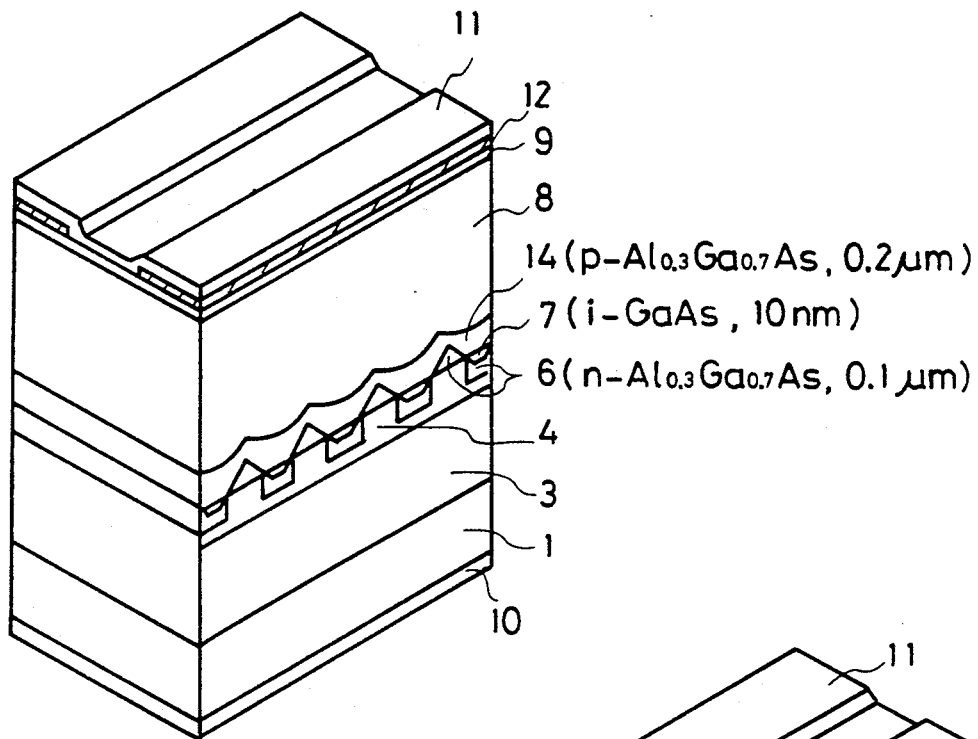
FIG. 10 is a perspective structural view showing the fifth embodiment of this invention.

FIG. 10 shows the fifth embodiment of this invention. The structure of this embodiment is formed by growing a buffer layer 6 under the condition that no growth occurs on the {111} B face and growing an active layer 7 in the valleys produced consequently. The active layer 7 formed is in the shape divided in the direction of the advancing light according to the period of the diffraction grating, and a guiding layer 14 is grown over the separated pieces of the active layer 7 in a manner to bridge them. On the guiding layer 14 is grown a cladding layer 8. Conditions of essential parts of the respective layers are noted in the figure. The conditions for the other layers are similar to the first embodiment.

SIXTH EMBODIMENT

Figure 11:
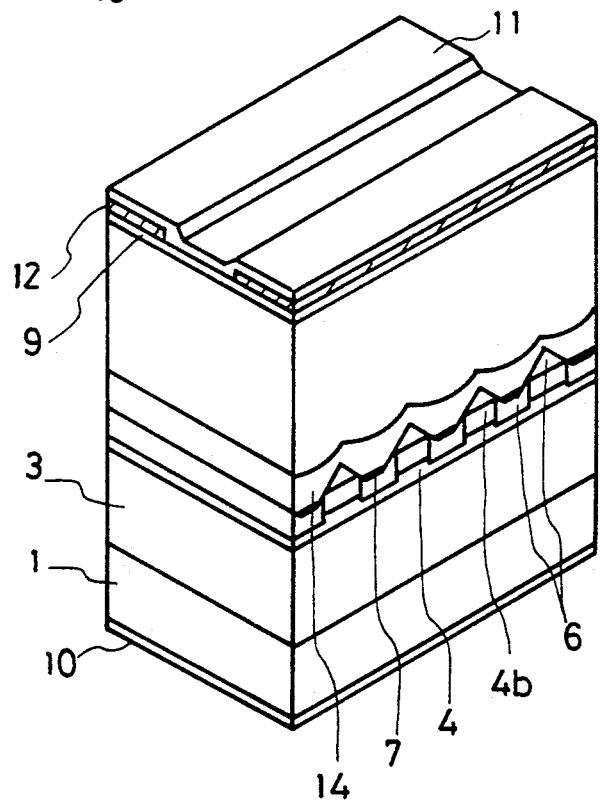
FIG. 11 is a perspective structural view showing the sixth embodiment of this invention.

FIG. 11 shows the sixth embodiment in structure. Similar to the fifth embodiment, the active layer 7 is divided in this embodiment, and is bridged by a guiding layer 14. But in this embodiment, the semiconductor layer 4 which is to be etched with the corrugation of the diffraction grating is grown slightly thinly, and a semiconductor layer 4b with a higher resistance is grown over it. The semiconductor layer 4b may be, for example, intrinsic Al$_{0.3}$Ga$_{0.7}$As of the thickness of 0.15 μm. This structure can concentrate electric current into the valleys of the diffraction grating.

Out of the manufacturing methods for above mentioned laser, an example of metal organic vapor phase epitaxy which is directly relevant to this invention will now be described in more detail. However, this example is only illustrative of a case which achieved an optimal result and in no way limits the scope of this invention. In practice, according to the know-how of the experts of this field about the device, material and semiconductor manufacturing method available, conditions disclosed herein may be suitably modified to realize this invention.

SEVENTH EMBODIMENT

FIGS. 12(a)–12(e) show schematically the manufacturing procedure of the seventh embodiment of this invention's semiconductor laser. In the structure shown, respective layers of a semiconductor laser diode of quantum well structure are epitaxially grown on an n$^+$-GaAs substrate 1 in two stages but continuously in metal organic vapor phase.

More particularly, in the first stage, as shown in FIG. 12(a), an n-type cladding layer 3 is grown on the substrate 1, and an active layer 7 is grown further thereon. More specifically, in a manner to make the AlAs compositional ratio change smoothly from 0.6 to 0.3, n-AlGaAs graded index layer 7G is grown in the average thickness of 0.15 μm, and then an extremely thin GaAs single quantum well layer 7W is grown thereon in the average thickness of 10 nm. A p-AlGaAs graded index layer 7G' is further grown in the average thickness of 0.15 μm in a manner to allow the AlAs compositional ratio to change smoothly from 0.3 to 0.6.

As shown in FIG. 12(b), masks 15 are formed with SiO$_2$ on the grown active layer 7 in the thickness of ca. 50 nm. The masks 15 are of the structure which withstands ion implantation, and are formed in coincidence to the period of the diffraction grating. In this embodiment, the masks are formed by interference exposure and etching at the period of 255 nm in the direction of advancing light. Then, as shown in FIG. 12(c), ion is implanted from above the surface of the active layer 7 which has been covered periodically with the masks 15. As shown in FIG. 12(d), the masks 15 are subsequently removed and the second stage semiconductor growth is conducted as shown in FIG. 12(e).

In other words, a p-AlGaAs layer is grown as a cladding layer 8 on the active layer 7 in the thickness of 1.5 μm and a p-GaAs capping layer 9 is further grown thereon in the thickness of 0.4 μm. Electrodes are vapor-deposited on the layer 9.

Similarly to the third embodiment shown in FIG. 7, the active layer 7 including the graded index layers and a quantum well may be manufactured according to the description in Bhat'paper.

The semiconductor laser of quantum well structure is taught by Asada as mentioned above.

The technology to disorder a quantum well layer by ion implantation is described in detail in the paper, "Low Dimensional Systems Quantum Wires and Quantum Boxes by MBE" by A. Gossard et al., Journal of Crystal Growth 81 (1987), pp. 101–105, Amsterdam.

Table 3 shows structures of respective layers of the embodiment.

TABLE 3

| No. | name of layer | aluminum compositional ratio | thickness |
|---|---|---|---|
| 9 | p-capping layer | 0 | 0.4 μm |
| 8 | p-cladding layer | 0.6 | 1.5 μm |
| 7G' | graded index layer (p-type) | 0.6–0.3 | 0.15 μm |
| 7W | quantum well layer | 0 | ca. 10 nm |
| 7G | graded index layer (n-type) | 0.3–0.6 | 0.15 μm |

TABLE 3 -continued

| No. | name of layer | aluminum compositional ratio | thickness |
|-----|---------------|------------------------------|-----------|
| 3 | n-cladding layer | 0.6 | 1.5 μm |
| 1 | substrate | 0 | — |

EIGHT EMBODIMENT

Figure 13A:
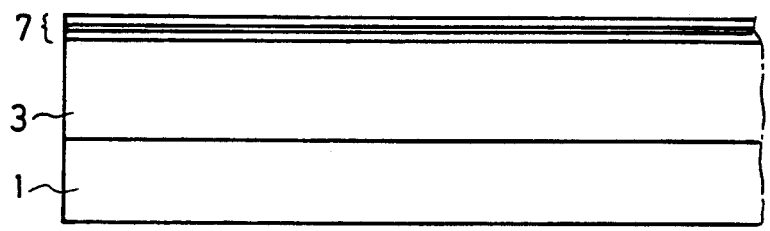
FIGS. 13(a)-(c) are sectional views showing the manufacture procedure of the eighth embodiment of this invention.
Figure 13B:
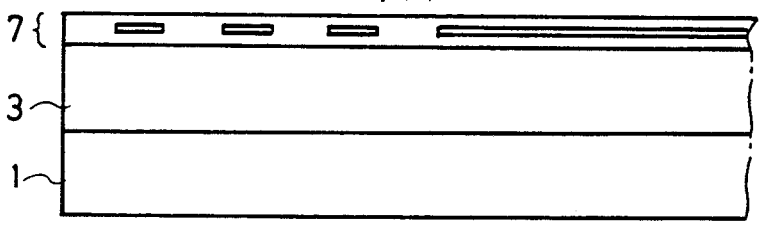
Figure 13C:
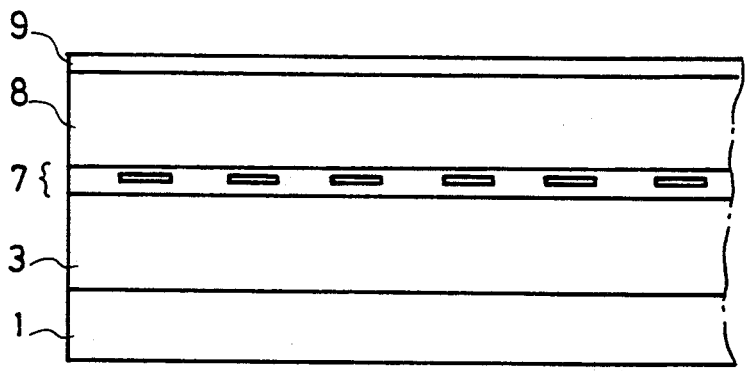

FIGS. 13(a)-13(c) are sectional views indicating the manufacturing process of the eighth embodiment of this invention. This embodiment differs from the seventh embodiment in that the active layer is disordered by focused ion beams (FIB). More specifically, as shown in FIG. 13(a), a substrate 1, a cladding layer 3, and an active layer 7 including a quantum well layer 7W are formed by semiconductor growth. Then, as shown in FIG. 13(b), an ion beam source 20 is scanned from above the active layer 7 to emit focused ion beams. While scanning, the ion beam source 20 is intermittently suspended of its supply of ion beams to repeat emission and suspension. As the period is adjusted to coincide with the period of the diffraction grating, by the time the ion beam scanning is completed, the quantum well layer 7W of the active layer 7 has been periodically disordered. As shown in FIG. 13(c), a cladding layer 8 and a contact layer 9 are grown thereupon by semiconductor growth.

Figure 14:
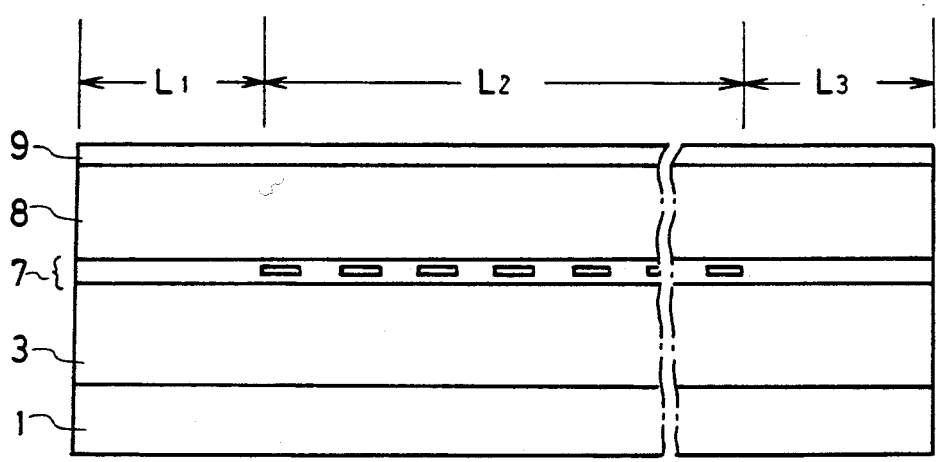
FIG. 14 shows an application of this invention.

FIG. 14 shows an application of the above embodiment wherein external light guiding components $L_1$ and $L_3$ are formed extending from both sides of a portion $L_2$ of the semiconductor laser.

In this structure, as the quantum well layer 7W of the active layer 7 has been disordered periodically according to the diffraction grating period in the direction of light waves, light distribution feedback is achieved by gain coupling based on periodical perturbation of gain factors according to the theory of Kogelnik et al.

The quantum well layer 7W may be structured with a multi quantum well layer (MQW) comprising plural quantum well layers and barriers in alternation.

As described in the foregoing statement, this invention realizes a semiconductor laser which performs light distributed feedback by gain coupling based on the periodic perturbation of gain coefficient according to the theory of Kogelnik et al. This invention's laser does not cause energy absorption loss unlike the prior application device which has a non-transparent layer, nor cause defects in semiconductor crystal structure even if a diffraction grating is formed on the active layer. It does not require any anti-reflection coating.

Therefore, the semiconductor laser according to the present invention is stable in lasing mode without causing two mode lasing. This invention's semiconductor laser is simple in forming the diffraction grating, does not need formation of an anti-reflection coating on the diode facet, has a simple structure and a simple manufacturing process, will achieve an excellent production yield, and is low in production cost. This invention can eliminate disadvantages of the prior application laser such as energy absorption loss and does not develop defects in the semiconductor crystal structure of the active layer even if the diffraction grating is formed to thereby effectively generate stimulated emission.

The semiconductor laser according to this invention can be manufactured with the lasing wavelength determined in advance, and is most suitable to mass production. Therefore it is extremely useful as a light source for long distance optical communication system, wavelength division multiplex optical communication systems, optical information processing systems, optical information memory systems, optical measuring instruments and other various opt-electronic systems and devices.

The scope of the invention is not to be limited by the foregoing exemplary embodiments but by the following claims.

What is claimed is:

1. A device for use in a semiconductor laser comprising:
   an active layer to generate stimulated emission,
   a diffraction grating on the active layer to give light distributed feedback,
   said diffraction grating being formed on one of the surfaces of said active layer as a corrugated pattern with valleys and projections,
   a semiconductor buffer layer in contact with the corrugated pattern formed on said surface,
   said corrugated pattern etched on a semiconductor layer which contacts with the other surface of the buffer layer.

2. The device as claimed in claim 1 wherein said buffer layer has a uniform thickness, and the corrugated patterns on both surfaces of the layer are parallel to each other across the buffer layer.

3. The device laser as claim in claim 1 wherein the thickness of said buffer layer is 0.01 to 1 μm.

4. The device as claimed in claim 1 wherein the active layer includes one of a single and multi quantum well layer.

5. A device for use in a semiconductor laser comprising:
   an active layer to generate stimulated emission,
   a diffraction grating on the active layer to give light distributed feedback,
   said diffraction grating being formed on one of the surfaces of said active layer in a corrugated pattern with valleys and projections,
   the active layer having a structure to change the thickness distribution according to the corrugated shapes thereof,
   a semiconductor buffer layer in contact with the corrugated pattern formed on said surface of the active layer,
   a semiconductor layer having the corrugated pattern etched in contact with the other surface of the buffer layer,
   said buffer layer being of the structure which is epitaxially grown to transmit the corrugated pattern etched on the semiconductor layer on which the other surface of the buffer layer includes at least partially a buffer layer which is shaped to emphasize the corrugated pattern with the valleys and hills etched on said semiconductor layer.

6. A device for use in a semiconductor laser comprising:
   an active layer to generate stimulated emission,
   a diffraction grating on the active layer to give light distribution feedback,
   said active layer including one of a single and multiple quantum well layer, and
   the quantum well layer being disordered according to the period of said diffraction grating.

* * * * *